United States Patent
Yadav

(10) Patent No.: US 8,060,721 B1
(45) Date of Patent: *Nov. 15, 2011

(54) APPARATUS AND METHOD FOR A SYNCHRONOUS MULTI-PORT MEMORY

(75) Inventor: Rishi Yadav, Hudson, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 170 days.

This patent is subject to a terminal disclaimer.

(21) Appl. No.: 12/191,102

(22) Filed: Aug. 13, 2008

Related U.S. Application Data

(63) Continuation of application No. 11/015,959, filed on Dec. 16, 2004, now Pat. No. 7,421,559.

(60) Provisional application No. 60/531,279, filed on Dec. 18, 2003.

(51) Int. Cl.
*G06F 12/00* (2006.01)

(52) U.S. Cl. ........ 711/169; 711/109; 711/131; 711/149; 711/150; 711/151; 365/230.05; 365/230.08

(58) Field of Classification Search ............... 711/169, 711/109, 131, 149, 150, 151; 365/230.05, 365/230.08
See application file for complete search history.

(56) References Cited

U.S. PATENT DOCUMENTS

| | | | |
|---|---|---|---|
| 4,967,398 A | 10/1990 | Jamoua et al. | |
| 5,274,774 A * | 12/1993 | Manber et al. ................ | 710/125 |
| 5,398,211 A | 3/1995 | Willenz et al. | |
| 5,557,768 A | 9/1996 | Braceras et al. | |
| 5,748,968 A | 5/1998 | Nally et al. | |
| 5,768,211 A | 6/1998 | Jones et al. | |
| 6,078,527 A | 6/2000 | Roth et al. | |
| 6,094,532 A | 7/2000 | Acton et al. | |
| 6,167,487 A | 12/2000 | Camacho et al. | |
| 6,360,307 B1 | 3/2002 | Raftery et al. | |
| 6,388,939 B1 | 5/2002 | Manapat et al. | |
| 6,532,524 B1 | 3/2003 | Fan et al. | |
| 6,598,178 B1 | 7/2003 | Yee et al. | |
| 6,717,834 B2 | 4/2004 | Zagorianakos et al. | |
| 6,934,824 B2 * | 8/2005 | Woo et al. .................... | 711/168 |

OTHER PUBLICATIONS

Ken-ichi Endo, Tsuneo Matsumura, Junzo Yamada, "Pipelined, Time-Sharing Access Technique for an Integrated Multiport Memory", IEEE Journal of Solid-State Circuits, vol. 26, No. 4, Apr. 1991.

* cited by examiner

*Primary Examiner* — Matthew Bradley
*Assistant Examiner* — Kalpit Parikh

(57) ABSTRACT

A method of and apparatus for arbitrating a memory access conflict to a memory array. The apparatus may include selection logic coupled with a plurality of ports and a memory array to arbitrate among a plurality of contending memory access requests and to conditionally block write data from accessing the memory array when write data arrives late in time.

4 Claims, 11 Drawing Sheets

READ-READ CONTENTION

APPARATUS AND METHOD FOR A SYNCHRONOUS MULTI-PORT MEMORY

RELATED APPLICATION

This application is a continuation of U.S. application Ser. No. 11/015,959 filed Dec. 16, 2004, now U.S. Pat. No. 7,421,559, which claims the benefit of U.S. Provisional Application No. 60/531,279, filed Dec. 18, 2003.

TECHNICAL FIELD

Embodiments of the invention relate generally to electronic circuits, and in particular to circuits for multi-port memories.

BACKGROUND

Multi-port memories are commonly used to transfer data among different synchronous systems that are asynchronous with respect to each other. An example of such a memory is a dual-port synchronous random access memory (SRAM) as shown in FIG. 1. In FIG. 1, the dual-port memory 100 has a left port and a right port. The left port has a data bus 101, an address bus 103, a control line 105 and a status line 107. The signals on these buses and lines are synchronous to a left clock (LCLK) 109. Similarly, the right port has a data bus 102, an address bus 104, a control line 106 and a status line 108. The signals on these buses and lines are synchronous to a right clock (RCLK) 110. There is no relationship between the left clock (LCLK) and the right clock (RCLK); they are asynchronous with respect to each other.

When the ports access different memory locations in the dual port memory 100, even at overlapping times, data can be written to or read from the memory by each port as if the other port did not exist. There is no memory address contention and the transfer of data takes place normally. However, when both ports try to access the same memory location at the same time, the data at that location might have an unexpected content. For example, if one port is trying to read a memory location while the other is writing to the memory location, the read data may be old data, new data or even corrupted data based on the timing of the internal read cycle. One way to avoid this problem is to have a mechanism for deciding which port, among contending ports, will be granted either sole or priority access to the memory address location, and to notify the other ports of the results. This process is referred to as arbitration.

FIG. 2 illustrates an arbitration path 200 in a conventional dual port memory, where the left port is attempting to write to a memory location and the right port is attempting to read from the same memory location. For simplicity, FIG. 2 assumes that the left port loses the arbitration so only the affected left port write control path is illustrated. In FIG. 2, the left port address is clocked into register 201 and the right port address is clocked into register 202. The exclusive OR gate 203 represents a filter that detects left port and right port address matches and passes them on to arbiter core cell 204 for timing arbitration. The arbiter core cell 204 is typically an RS flip-flop with fast recovery time from meta-stable conditions. Clock delay elements 205 are used to insert timing delays greater than or equal to the setup time of arbiter core cell 204. The nominal data-in to arbitration-out time of the arbiter core cell is pushed out if the address match arrival time on one of its inputs violates the setup time with respect to the other. In the example shown, the arbitration result (L_BUSY) is used to clear register 206 when it is clocked by the delayed LCLK signal 109. Absent the arbitration result, left port address 103 would be logically AND'd with the left port write enable signal 207 and clocked into register 208. The critical nature of the timing for this path is shown by the typical propagation and setting time delays (in nanoseconds) for the individual components in the path. As illustrated in FIG. 2, the total delay for this path from input register 201 (or 202) to output register 208, including clock skew, is 1.9 nanoseconds. In a double data rate (DDR) memory, for example, this delay would limit the maximum clock frequency to 263 Mhz without dropping clock cycles.

In addition to the read-write scenario described above, arbitration may be required when multiple ports are attempting to read the same memory location and when multiple ports are attempting to write to the same memory location. In the first case, if too many ports are allowed to read the same memory location at once, enough read current maybe drawn from the memory cell to de-stabilize it. In this case, an arbitration process might allow access by only one port or a limited number of ports, block access by all other ports and provide a busy signal on the status line of each blocked port. In the second case, only one port can be allowed to write to a memory location at one time, because otherwise the data will be corrupted. All other ports should be blocked from writing to the memory, and notified via a status signal. This latter arbitration function, blocking write operations, is one of the most critical timing paths in multi-port memory designs because the asynchronous clock domains create meta-stable conditions that require extra time to resolve, and address setup violations that can result in large timing pushouts, wasting memory cycles.

BRIEF DESCRIPTION OF THE DRAWINGS

The present invention is illustrated by way of example, and not by limitation, in the figures of the accompanying drawings in which.

DETAILED DESCRIPTION

An apparatus and method for a synchronous multi-port memory is described. In one embodiment, the apparatus includes a plurality of ports coupled with a memory array, wherein each port includes a delay stage to delay a memory access while a memory access arbitration is performed. Selection logic is coupled with the plurality of ports and the memory array to arbitrate among a plurality of contending memory access requests, to select a prevailing memory access request and to implement memory access controls. In one embodiment, a method for a synchronous multi-port memory includes receiving, at a first port, a first access request to a memory location, wherein the first access request is a first request in time. The method also includes receiving, at a second port, a second access request to the memory location, wherein the second access request is a second request in time. The method selects the first access request, modifies the second access request, executes the first access request and conditionally executes the second access request.

In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention. It should be noted that the "line" or "lines" discussed herein, that connect elements, may be single lines or multiple lines. It will also be understood by one having ordinary skill in the art that lines and/or other coupling elements may be identified by the nature of the signals they carry (e.g., a "clock line" may implicitly carry a "clock signal") and that input and output ports may be identified by the nature of the signals they receive or transmit (e.g., "clock input" may implicitly receive a "clock signal"). It will also be appreciated by one having ordinary skill in the art that "logic" as used herein, may refer to combinatorial or sequential logic and that the logic functions described herein may be realized in a variety of configurations known to one of ordinary skill in the art.

Figure 1:
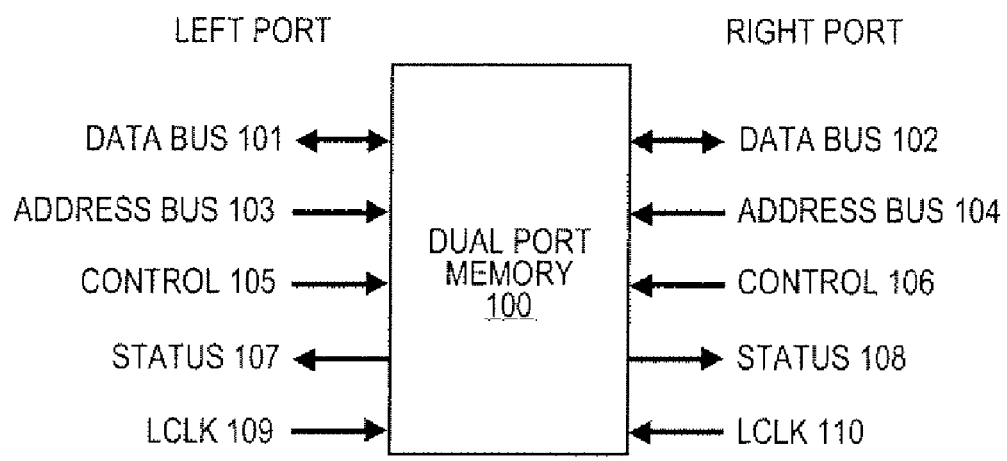
FIG. 1 illustrates interfaces of a dual port memory.
Figure 2:
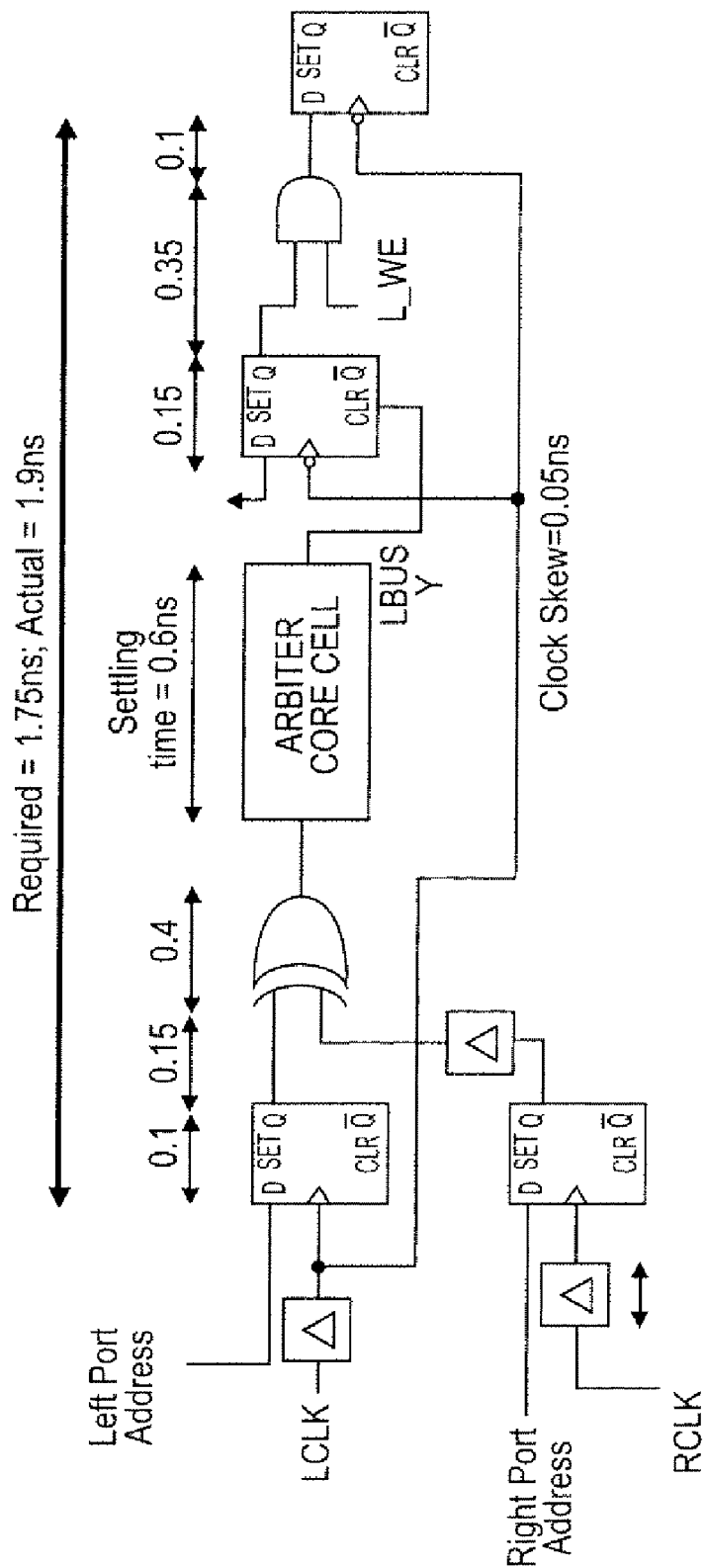
FIG. 2 illustrates an arbitration path in a conventional dual port memory.
Figure 3:
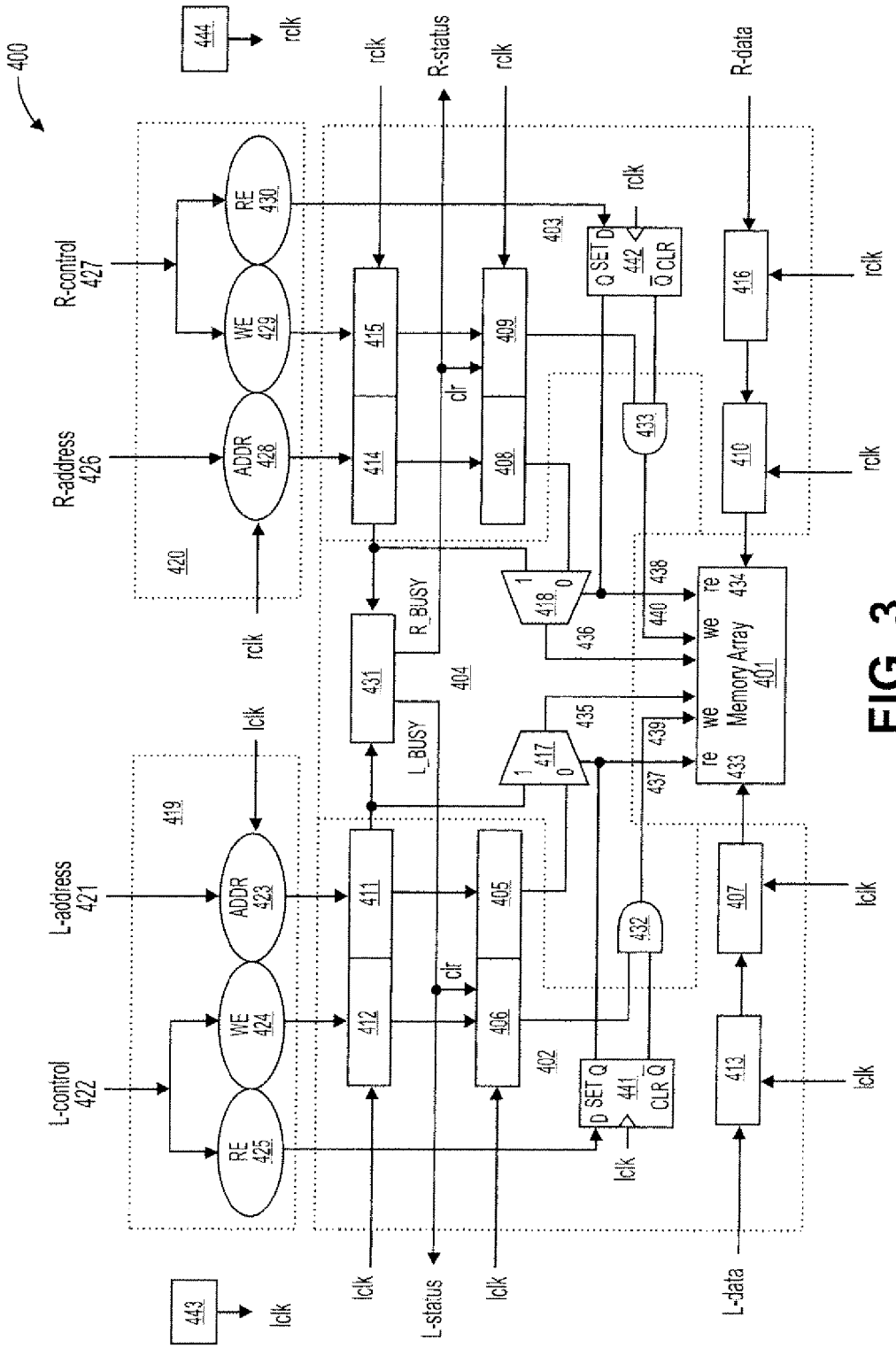
FIG. 3 illustrates one embodiment of a synchronous multi-port memory.

FIG. 3 illustrates one embodiment of a synchronous multi-port memory 400. In order to simplify the description of synchronous multi-port memory 400, an exemplary dual-port memory configuration is shown. It will be appreciated by one skilled in the art that the operative principles of the exemplary dual-port embodiment may be extended to more than two ports. It will also be appreciated that the two ports illustrated in FIG. 3 may be designated as a left port and a right port to clarify the description, without a loss of generality.

Synchronous multi-port memory 400 includes an asynchronous memory array 401, which may be any type of asynchronous memory array, including asynchronous static random access memory (SRAM) and asynchronous dynamic random access memory (DRAM) and may include data inputs 433 and 434, address inputs 435 and 436, read enable inputs 437 and 438 and write enable inputs 439 and 440. The operation and interconnection of these inputs is described in detail below. Memory array 401 may be coupled with a left port 402 and a right port 403. Left port 402 and right port 403 may each include a delay stage to delay a memory access to memory array 401 while a memory access arbitration is performed, as described in detail below.

In left port 402, the delay stage may include an address delay element 405, a control delay element 406 and a data delay element 407. Similarly, the delay stage in right port 403 may include address delay element 408, control delay element 409 and data delay element 410. Address delay elements 405 and 408, control delay elements 406 and 409, and data delay elements 407 and 410 may be any type of data storage elements, including registers, latches and flip-flops. Left port 402 and right port 403 may also each include an input stage, coupled with the delay stage, to receive memory access requests. In left port 402, the input stage may include an address input element 411, a control input element 412 and a data input element 413. Similarly, the input stage in right port 403 may include address input element 414, control input element 415 and data input element 416. Address input elements 411 and 414, control input elements 412 and 415, and data input elements 413 and 416 may be any type of data storage elements, including registers, latches and flip-flops. Left port 402 may also include an address multiplexer 417, coupled with address input element 411, address delay element 405 and address input 435 of memory array 401, to select a left port read or write address in the memory array 401. Similarly, right port 403 may also include address multiplexer 418, coupled to address input element 414, address delay element 408 and address input 436 of memory array 401, to select a right port read or write address in the memory array 401.

Multi-port memory 400 may also include a left port input logic 419 and a right port input logic 420. Left port input logic 419 may be configured to decode left port address 421 and left port control signal 422, and may include address decode logic 423, write decode logic 424 and read decode logic 425. Similarly, right port input logic 420 may be configured to decode right port address 426 and right port control signal 427, and may include address decode logic 428, write decode logic 429 and read decode logic 430. Address and control signal decoding is well known in the art and will not be discussed in detail here. It will be appreciated, however, that left port input logic 419 and right port input logic 420 may be configured to support a variety of data rates and interfaces, independent of the configurations of left port 402 and right port 403. For example, left port input logic 419 and right port input logic 420 may be configured to accept single data rate inputs (SDR) or double data rate input (DDR). Similarly, the clock inputs of left input logic 419 and right input logic 420 may be adjusted to accommodate both source-synchronous and source-centered operation. Read decode logic 425 may be coupled to data latch 441, which may be configured to hold a left port read enable signal provide by read decode logic 425. In one embodiment, data latch 441 may be a D-latch having both a Q output (DATA) and a !Q output (NOT DATA). Similarly, read decode logic 430 may be coupled to data latch 442, which may be configured to hold a right port read enable signal provide by read decode logic 430. In one embodiment, data latch 442 may be a D-latch having both a Q output (DATA) and a !Q output (NOT DATA). Data latch 441 may also be coupled with multiplexer 417, to select a left port memory address from one of address input register 411 and address delay register 405 and to provide left port read enable input 437 to memory array 401. Similarly, data latch 442 may also be coupled with multiplexer 418, to select a right port memory address from one of address input register 414 and address delay register 408 and to provide right port read enable input 438 to memory array 401.

Multi-port memory 400 may also include selection logic 404, which may be coupled to memory array 401, left port 402 and right port 403. Selection logic 404 may include an arbitration cell 431, which may be coupled with address input element 411 and address input element 414, to arbitrate among left port and right port memory access requests. Arbitration cell 431 may also be coupled with control delay element 406 and control delay element 409 to clear one of control delay elements 406 and 409 as the result of memory access arbitration. Arbitration cells are known in the art and will not be described in detail here. Selection logic 404 may also include control logic 432 to combine signals from data latch 441 and control delay element 406 and to derive left port write enable input 439 to memory array 401. Selection logic 404 may also include control logic 433 to combine signals from data latch 442 and control delay element 409 and to derive right port write enable input 440 to memory array 401.

Multi-port memory 400 may also include a left port clock distribution network (not shown) to distribute the left clock signal (LCLK) from left port clock 443 to synchronous elements in left port 402, such as the left port input logic 419, the left port input stage, the left port delay stage and the data latch 441. Multi-port memory 400 may also include a right port clock distribution network (not shown) to distribute the right clock signal (RCLK) from left port clock 444 to synchronous elements in right port 402, such as the right port input logic 419, the left port input stage, the left port delay stage and the data latch 442.

As discussed above, with respect to conventional multi-port memories, arbitration cell 431 is configured to determine which of a memory access request from left port 402 and a contending memory access request from right port 403 is the first request in time. The first memory access request in time is determined to be the winning, or prevailing memory access request. From that determination point, there are four possible scenarios: 1) the first request is a write request and the second request is a write request; 2) the first request is a read request and the second request is a write request; 3) the first request is a write request and the second request is a read request; and 4) the first request is a read request and the second request is a read request. Each of these scenarios is described in detail below. It will be appreciated that in the following descriptions the left port 402 is treated as the first, or prevailing port, and the right port is treated as the second, or non-prevailing port without loss of generality because the left and right ports are symmetrical. It will also be appreciated that while the following description assumes that logic states are defined as positive-true and active-high and that clock transitions are edge-triggered, embodiments of the present invention are not limited to those conventions.

Write-Write Contention

Figure 4:
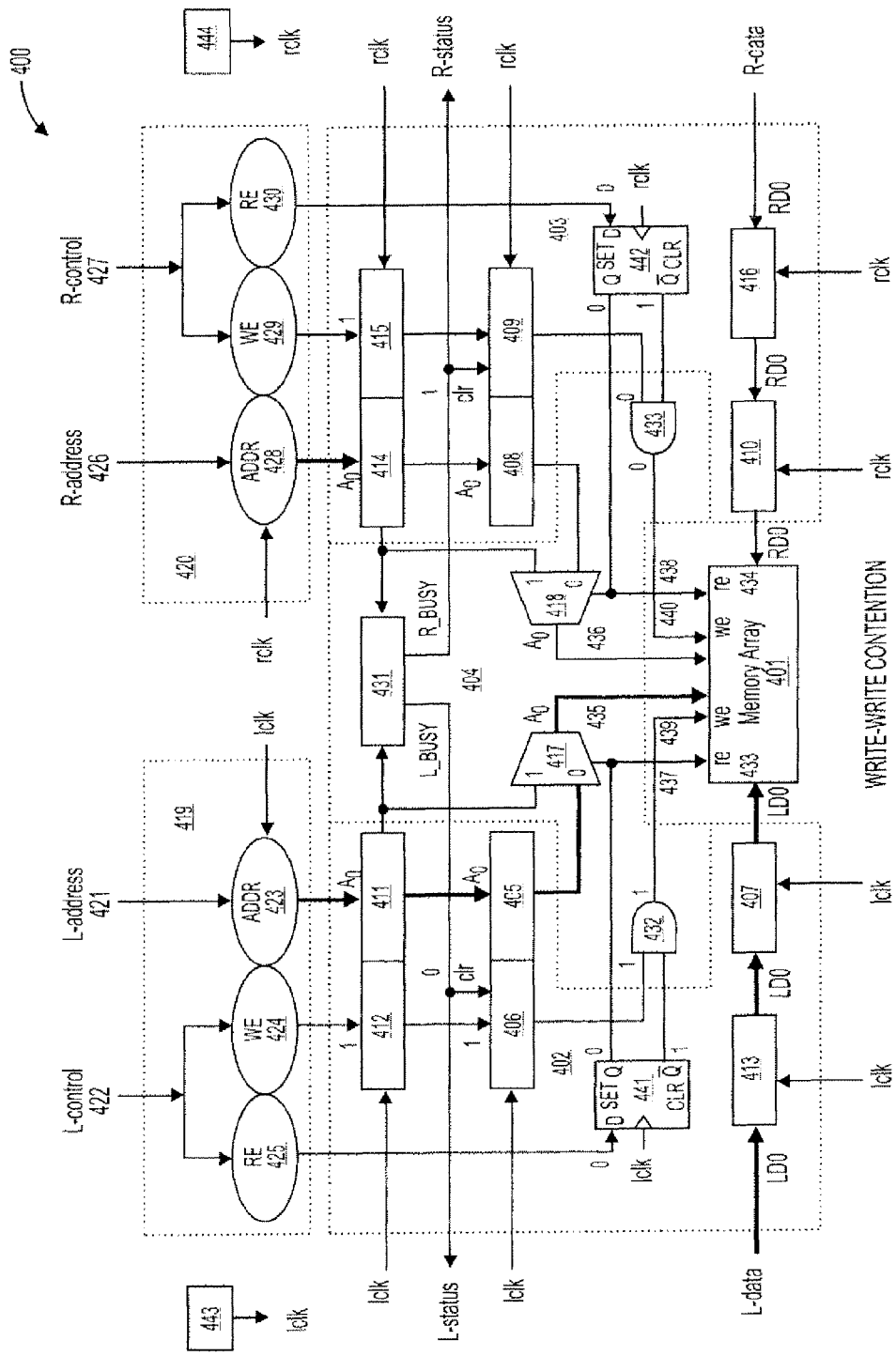
FIG. 4 illustrates WRITE-WRITE contention in one embodiment of a synchronous multi-port memory.

FIG. 4 illustrates the operation of one embodiment of synchronous multi-port memory 400 when both the left port 402 and the right port 403 request write access to a memory address A0 in memory array 401. On a first LCLK transition after the left port address 421 and control signal 422 are decoded, address A0 is clocked into input address element 411, a logical "1" (write enable) is clocked into input control element 412, a logical "0" (read disable) is clocked into latch 441 and left port data LD0 is clocked into data input element 413.

On a subsequent RCLK transition, after right port address 426 and control signal 427 are decoded, address A0 is clocked into input address element 414, a logical "1" (write enable) is clocked into input control element 415, a logical "0" (read disable) signal is clocked into latch 442 and right port data RD0 is clocked into data input element 416. Arbitration cell 431 arbitrates between left port 402 and right port 403 and sets a R-BUSY control line high (logical "1") at a CLEAR input of control delay element 409. At the same time, arbitration cell 431 sets L-BUSY control line low (logical "0") at a CLEAR input of control delay element 406. Note that the L-BUSY and R-BUSY lines may also be connected to the left port status output and the right port status output, respectively, to notify any external devices or systems of an arbitration result.

On the next LCLK transition, address A0 is clocked into address delay element 405, the logical "1" (write enable) is clocked into control delay element 406 and left port data LD0 is clocked into data delay element 407. The logical "1" (write enable) in control delay element 406 is logically AND'd with the !Q output (logical "1") of data latch 441, in control logic 432, to assert a write enable command (logical"1") at the left port write enable input 439 of memory array 401. At the same time, the Q output of data latch 441 (logical "0") is used to assert a read disable command at the read enable input 437 of memory array, and to select address A0 from address delay element 405 via multiplexer 417. Thus, left port data LD0 is written from data delay element 407 into memory array 401 at address A0.

On the next RCLK transition, address A0 is clocked into address delay element 408 and right port data RD0 is clocked into data delay element 410. The logical "1" in input control element 415 is not clocked into control delay element 409, because the R-BUSY signal asserted by the arbitration cell 431 keeps control delay element 409 cleared. As a result, control delay element 409 presents a logical "0" to control logic 433 where it is logically AND'd with the !Q output (logical "1") of data latch 442 to assert a write disable command (logical "0") at the right port write enable input 440 of memory array 401. At the same time, the Q output of data latch 442 (logical "0") is used to assert a read disable command (logical "0") at the read enable input 438 of memory array 401. Thus, even though the Q output of data latch 442 selects address A0 from address delay element 408 via multiplexer 418, the write operation is disabled.

Write-Read Contention

Figure 5:
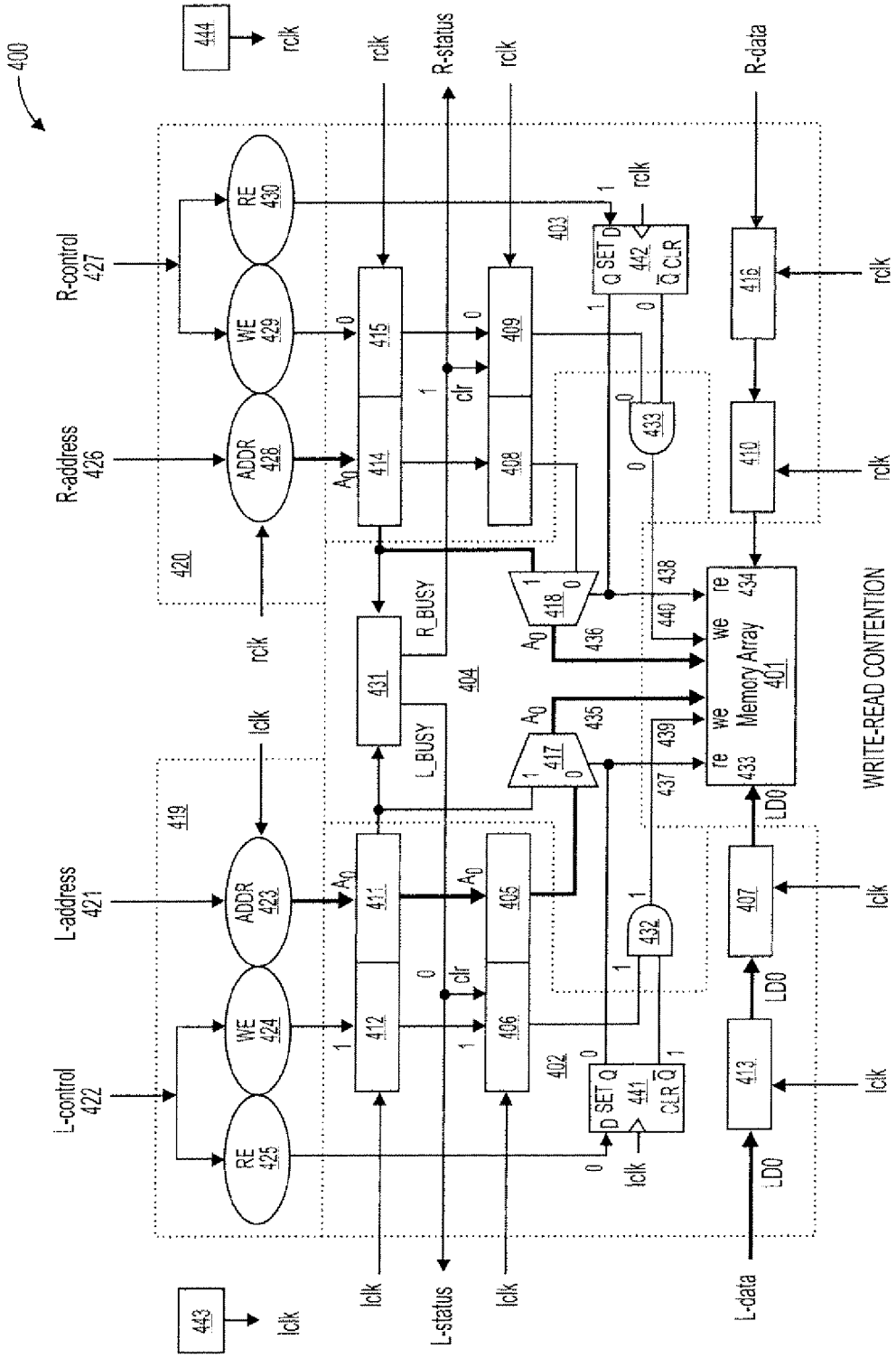
FIG. 5 illustrates WRITE-READ contention in one embodiment of a synchronous multi-port memory.

FIG. 5 illustrates the operation of one embodiment of synchronous multi-port memory 400 when the left port 402 requests write access to a memory address A0 in memory array 401 and the right port 403 requests read access to memory address A0 in memory array 401. On a first LCLK transition after the left port address 421 and control signal 422 are decoded, address A0 is clocked into input address element 411, a logical "1" (write enable) is clocked into input control element 412, a logical "0" (read disable) is clocked into latch 441 and left port data LD0 is clocked into data input element 413.

On a subsequent RCLK transition, after right port address 426 and control signal 427 are decoded, read address A0 is clocked into input address element 414, a logical "0" (write disable) into input control element 415, and a logical "1" (read enable) into latch 442. Arbitration cell 431 arbitrates between left port 402 and right port 403 and sets the R-BUSY control line high (logical "1") at the CLEAR input of control delay element 409, which expresses a logical "0" to control logic 433. The logical "1" clocked into latch 442 is expressed as a logical "0" at the !Q output of latch 442 and logically AND'd in control logic 433 with the logical "0" expressed by control delay element 409 to assert a write disable command (logical "0") at the write enable input 440 of memory array 401. The Q output of latch 442 (logical "1") asserts a read enable command at the read enable input 438 of memory array 401. The same Q output selects read address A0 from input address element 414 via multiplexer 418, and a right port read operation is initiated. The architecture of the read data path is described in detail below.

On the next LCLK transition, address A0 is clocked into address delay element 405, the logical "1" (write enable) is clocked into control delay element 406 and left port data LD0 is clocked into data delay element 407. The logical "1" (write enable) in control delay element 406 is logically AND'd with the !Q output (logical "1") of data latch 441, in control logic 432, to assert a write enable command (logical"1") at the left port write enable input 439 of memory array 401. At the same time, the Q output of data latch 441 (logical "0") is used to assert a read disable command at the read enable input 437 of memory array, and to select address A0 from address delay element 405 via multiplexer 417. Thus, left port data LD0 is written from data delay element 407 into memory array 401 at address A0.

Read-Write Contention

Figure 6:
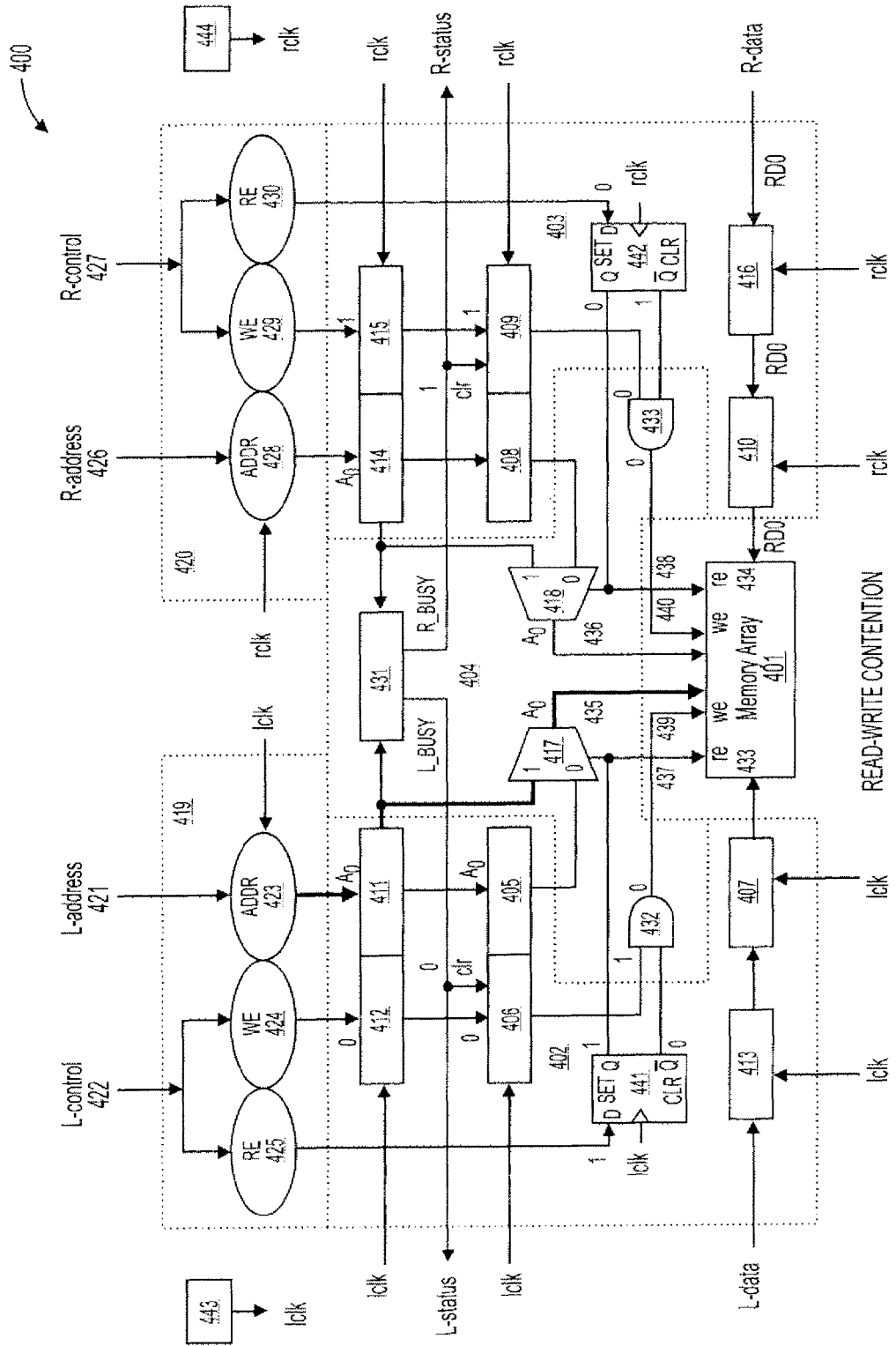
FIG. 6 illustrates READ-WRITE contention in one embodiment of a synchronous multi-port memory.

FIG. 6 illustrates the operation of one embodiment of synchronous multi-port memory 400 when the left port 402 requests read access to a memory address A0 in memory array 401 and the right port 403 requests write access to memory address A0 in memory array 401.

On a first LCLK transition after the left port address 421 and control signal 422 are decoded, address A0 is clocked into input address element 411, a logical "0" (write disable) is clocked into input control element 412 and a logical "1" (read enable) is clocked into latch 441.

On a subsequent RCLK transition, after right port address 426 and control signal 427 are decoded, address A0 is clocked into input address element 414, a logical "1" (write enable) is clocked into input control element 415, a logical "0" (read disable) signal is clocked into latch 442 and right port data RD0 is clocked into data input element 416. Arbitration cell 431 arbitrates between left port 402 and right port 403 and sets a R-BUSY control line high (logical "1") at the CLEAR input of control delay element 409. At the same time, arbitration cell 431 sets a L-BUSY control line low (logical "0") at a CLEAR input of control delay element 406.

On the next LCLK transition, address A0 is clocked into address delay element 405 and the logical "0" (write disable) in control input element 412 is clocked into control delay element 406. The logical "1" (write enable) in control delay element 406 is logically AND'd with the !Q output (logical "0") of data latch 441, in control logic 432, to assert a write disable command (logical "0") at the left port write enable input 439 of memory array 401. At the same time, the Q output of data latch 441 (logical "1") is used to assert a read enable command at the read enable input 437 of memory array 401 and to select address A0 from address input element 411 via multiplexer 417 and a left port read operation is initiated.

On the next RCLK transition, address A0 is clocked into address delay element 408 and right port data RD0 is clocked into data delay element 410. The logical "1" in input control element 415 is not clocked into control delay element 409, because the R-BUSY signal asserted by the arbitration cell 431 keeps control delay element 409 cleared. As a result, control delay element 409 presents a logical "0" to control logic 433 where it is logically AND'd with the !Q output (logical "1") of data latch 442 to assert a write disable command (logical "0") at the right port write enable input 440 of memory array 401. At the same time, the Q output of data latch 442 (logical "0") is used to assert a read disable command at the read enable input 438 of memory array 401. Thus, even though the Q output of data latch 442 selects address A0 from address delay element 408 via multiplexer 418, the write operation is disabled.

Read-Read Contention

Figure 7:
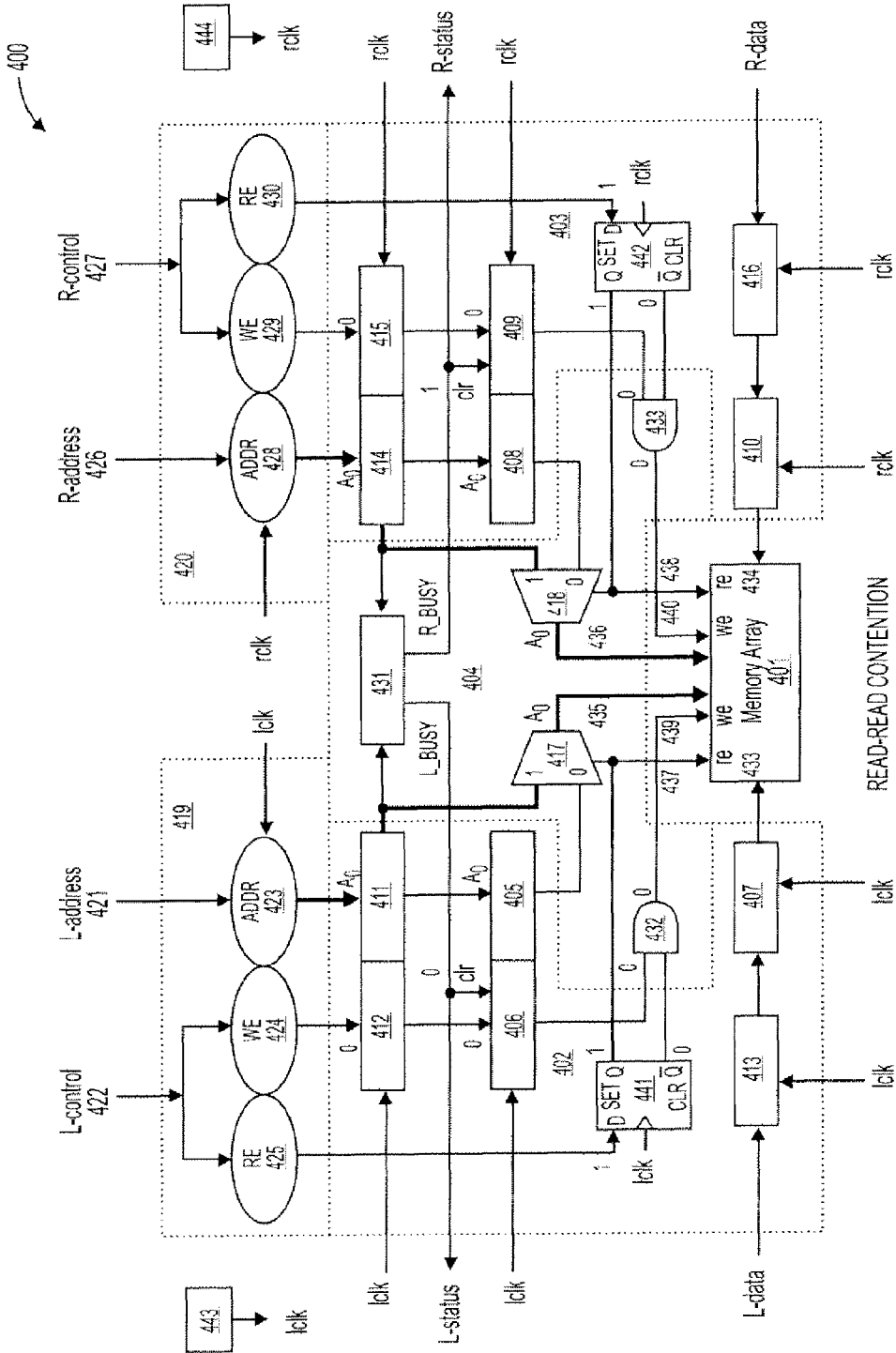
FIG. 7 illustrates READ-READ contention in one embodiment of a synchronous multi-port memory.

FIG. 7 illustrates the operation of one embodiment of synchronous multi-port memory 400 when the left port 402 requests read access to a memory address A0 in memory array 401 and the right port 403 also requests read access to memory address A0 in memory array 401.

On a first LCLK transition after the left port address 421 and control signal 422 are decoded, address A0 is clocked into input address element 411, a logical "0" (write disable) is clocked into input control element 412 and a logical "1" (read enable) is clocked into latch 441.

On a subsequent RCLK transition, after right port address 426 and control signal 427 are decoded, read address A0 is clocked into input address element 414, a logical "0" (write disable) into input control element 415, and a logical "1" (read enable) into latch 442. Arbitration cell 431 arbitrates between left port 402 and right port 403 and sets the R-BUSY control line high (logical "1") at the CLEAR input of control delay element 409, which expresses a logical "0" to control logic 433. The logical "1" clocked into latch 442 is expressed as a logical "0" at the !Q output of latch 442 and logically AND'd in control logic 433 with the logical "0" expressed by control delay element 409 to assert a write disable command at the write enable input 440 of memory array 401. The Q output of latch 442 (logical "1") asserts a read enable command at the read enable input 438 of memory array 401. The same Q output selects read address A0 from input address element 414 via multiplexer 418, and a right port read operation is initiated.

On the next LCLK transition, address A0 is clocked into address delay element 405 and the logical "0" (write disable) in control input element 412 is clocked into control delay element 406. The logical "1" (write enable) in control delay element 406 is logically AND'd with the !Q output (logical "0") of data latch 441, in control logic 432, to assert a write disable command (logical "0") at the left port write enable input 439 of memory array 401. At the same time, the Q output of data latch 441 (logical "1") is used to assert a read enable command at the read enable input 437 of memory array 401 and to select address A0 from address input element 411 via multiplexer 417 and a left port read operation is initiated.

Write Path Architecture

Figure 8:
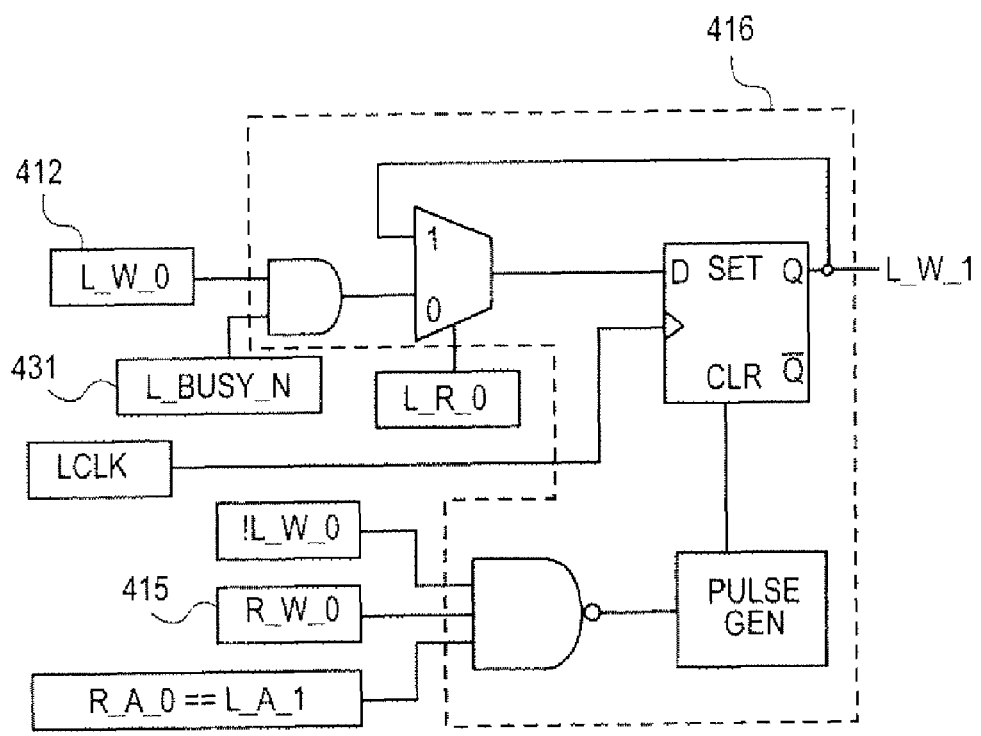
FIG. 8 illustrates an embodiment of logic for selecting valid write data.

FIG. 8 illustrates an embodiment of logic in left port control delay element 406 for validating write data status for the left port 402. It will be appreciated that a similar logic structure may be used to validate right port write data. In FIG. 8, L_W_0 is the current value of the write enable bit in left port control input element 412, L_BUSY is the arbitration result for the left port and L_R_0 is the current value of the read enable bit in the left port data latch 441. Also in FIG. 8, L_R_0 is the current value of the read enable bit in the right port data latch 442, !L_W_0 is the complement of L_W_0, R_W_0 is the current value of the write enable bit in right port control input element and [R_A_0==L_A_1] represents a logical comparison of the current address in right port address input element 414 with the current address in the left port address delay element 405. L_W_1 is the write enable output of the left port control delay element 406.

If the left port is in read mode (L_R_0="1" and L_W_0="0") and the right port updates the address in the right port address delay element, L_W_1 is cleared. On a write-to-read transition, the write enable signal 439 to the memory array 401 is immediately suspended to meet the read latency requirements for the left port. The data in the left port data delay element 407 is preserved for writing later. On a read-to-write transition, the write enable signal 439 is immediately turned on (after the internal read cycle has ended and if the data in the data delay element is still valid as described below), but the data and address are supplied from the delay elements 407, 405 for a clock cycle. After one clock cycle, and for all subsequent write cycles, the data is again written from the data delay element 407.

Read Path Architecture

From the foregoing description, it will be appreciated by one having ordinary skill in the art that a port requesting read access to memory array 401 may initiate a read operation within one clock cycle of an arbitration result because the read address may be retrieved from an address input element (e.g., address input element 411 or 414) rather than an address delay element (e.g., address delay element 405 or 408). As noted above, though, if a port is granted read access, data read from the memory array 401 may not be valid depending on the recent read-write history of the memory array 401. It may be possible under some circumstances, depending on the read-write history of the multi-port memory 400, to retrieve valid read data from a location other than the memory array 401.

During a read operation on a port, data should be sampled from the last written locations on all ports as well as in the memory core. If an attempt has been made to update an address location, but the corresponding physical location in the memory array 401 has not been updated, the data may exist in a location external to the memory array. This condition is flagged by the write enable bit for the left port in control delay element 406 and the write enable bit for the right port in control delay element 409. If these bits are 0, the data in the corresponding data delay element is no longer valid. The conditions for fetching data from alternative locations are depicted in FIG. 9.

Figure 9:
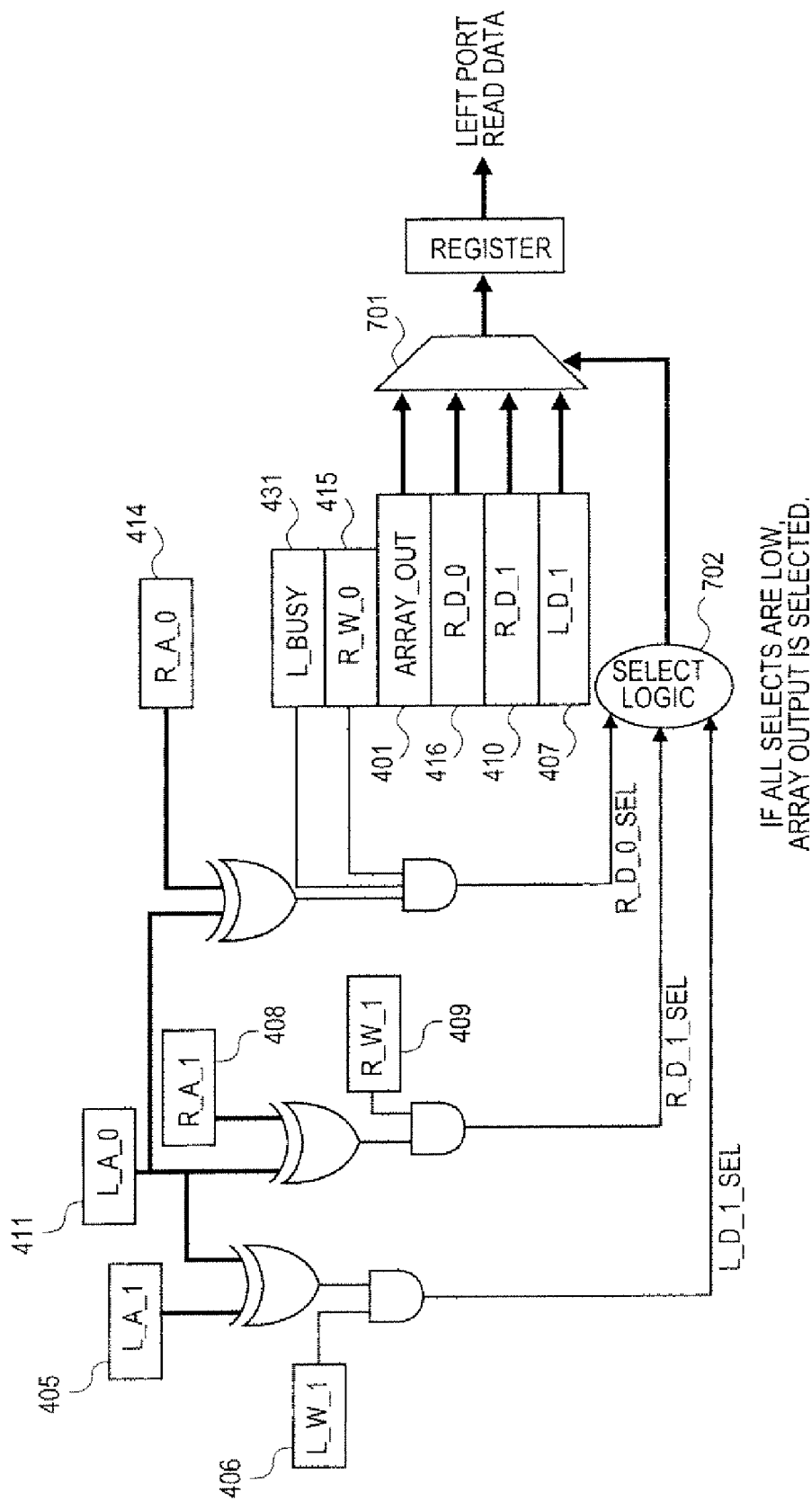
FIG. 9 illustrates an embodiment of logic for selecting valid read data.

FIG. 9 illustrates one behavioral embodiment of a read path architecture for the left port 402. It will be appreciated that a symmetrical right port read path architecture is also possible. In FIG. 9, a multiplexer 701 and selection logic 702 may be used to read data from one of the memory array 401, the right port data input element 416, the right port data delay element 410 and the left port data delay element 407.

In FIG. 9, L_A_0 is the current read address in the left port address input element 411 and L_A_1 is the address in the left port address delay element 405 (which was in 411 on the previous clock cycle). If L_A_0 matches L_A_1, and the data from last left port write operation is still valid (indicated by a write enable bit L_W_1 in left port control delay element 406), then the left port is trying to read the data that it started to write during the last write cycle. That data (L_D_1) will be found in left port data delay element 407, from where it is read. Data delay element 407 holds its data and writes it to the memory array 401 on the first write cycle after any consecutive read operations are completed, provided it is still valid (L_W_1="1"). Data delay element 407 writes immediately to the memory array 401 only if the write cycle that loaded the data is followed by another write cycle.

If the current left port read address L_A_0 matches the address in the right port address delay element 408 (designated as R_A_1 in FIG. 9), and the previous right port operation was a write operation (indicated by a write enable bit R_W_1 in right port control delay element 408), then the left port is trying to read the data that the right port started to write during the last write cycle. That data (R_D_1) will be found in right port data delay element 410, from where it is read. Data delay element 410 holds its data and writes it to the memory array 401 on the first write cycle after any consecutive read operations are completed, provided it is still valid (R_W_1="1"). Data delay element 410 writes immediately to the memory array 401 only if the write cycle that loaded the data is followed by another write cycle.

If the current left port read address L_A_0 matches the current right port address in the right port address input element 414 (identified as R_A_0 in FIG. 9), the current right port operation is a write operation (indicated by a write enable bit R_W_0 in right port control input element 415) and the left port is the non-prevailing port in the address contention (L_BUSY is asserted by arbitration cell 431), then the data in the right port data input element 416 (identified as R_D_0 in FIG. 9) is valid data for the left port read operation, and will be read from that location. Data input element 416 writes its data to the right port data delay element 410 where it is held while any consecutive read operations are completed. The data is written to the memory array 401 on the first write cycle thereafter, provided it is still valid (R_W_1="1"). If none of the previously described conditions is met, then the left port read data will be selected from the memory array 401.

Figure 10:
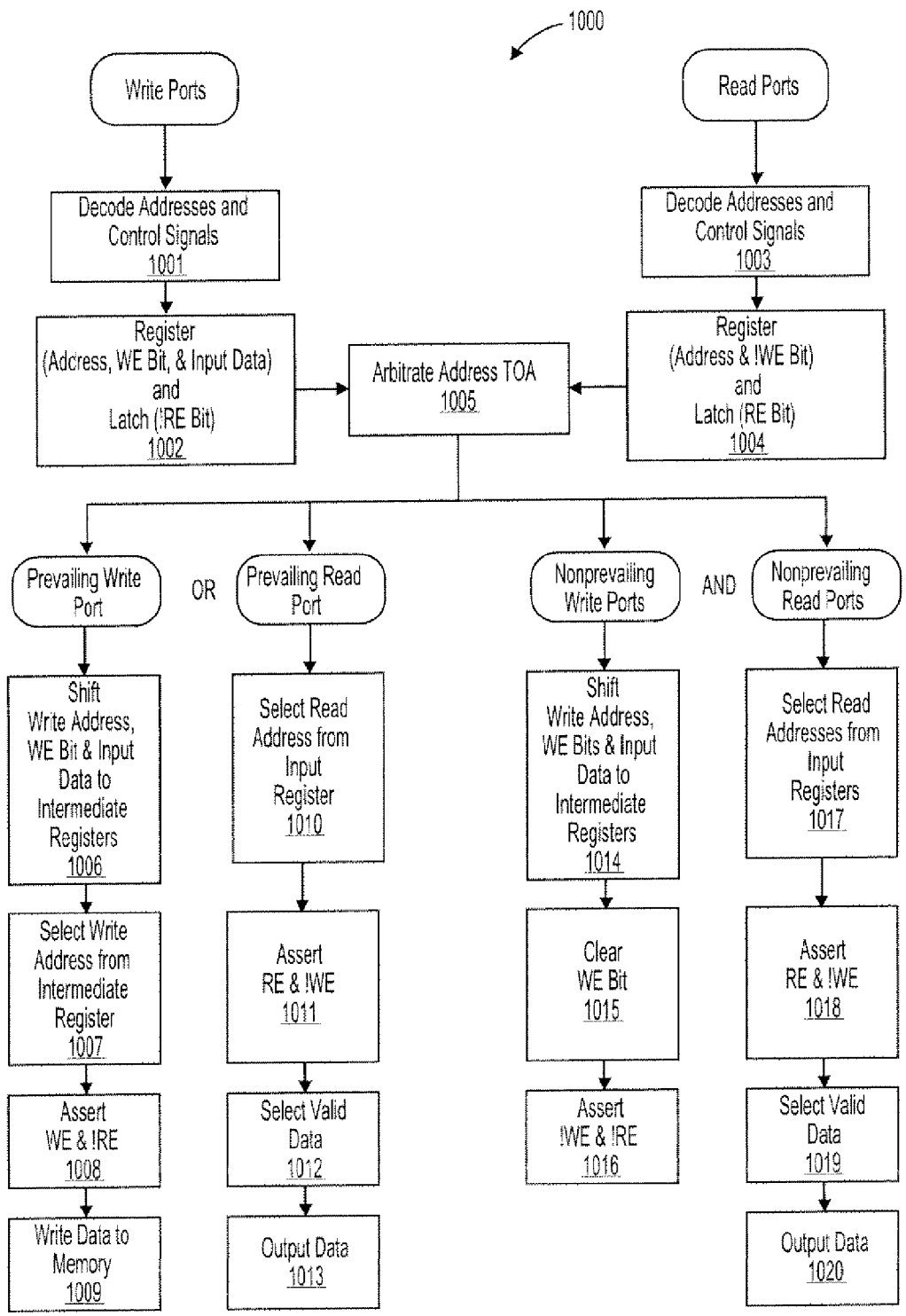
FIG. 10 illustrates a method in one embodiment of a synchronous multi-port memory.

FIG. 10 illustrates a method 1000 in one embodiment of a synchronous multi-port memory. For write ports, the method begins by decoding write address and control signals (1001). Next, a write address, a write enable bit and write data are stored in input registers, and a read disable bit is latched into each write port (1002). For read ports, the method begins by decoding read addresses and control signals (1003). Next, a read address, a write disable bit and a read address are stored in input registers, and a read enable bit is latched into each read port (1004). Next, the read and write address times of arrival are arbitrated (1005).

If the prevailing port is a write port, the method continues by shifting the write address, the write enable bit and the write data to intermediate registers (1006). The write address is selected from its intermediate register (1007), write enable and read disable signals are asserted at a memory array (1008) and the write data is written to a memory array. If the prevailing port is a read port, the method continues after arbitration by selecting the read address from the input register (1010), asserting read enable and write disable signals at the memory array (1011), selecting the location of valid read data (1012) and outputting the data (1013).

For a non-prevailing write port, the method continues after arbitration by shifting the write address, the write enable bit and the write data to intermediate registers (1014), clearing the write enable bit in response to the arbitration outcome (1015) and asserting write disable and read disable at the memory array (1016). For a non-prevailing read port, the method continues after arbitration by selecting the read address from the input register (1017), asserting read enable and write disable signals at the memory array (1018), selecting the location of valid read data (1019) and outputting the read data (1020).

Figure 11:
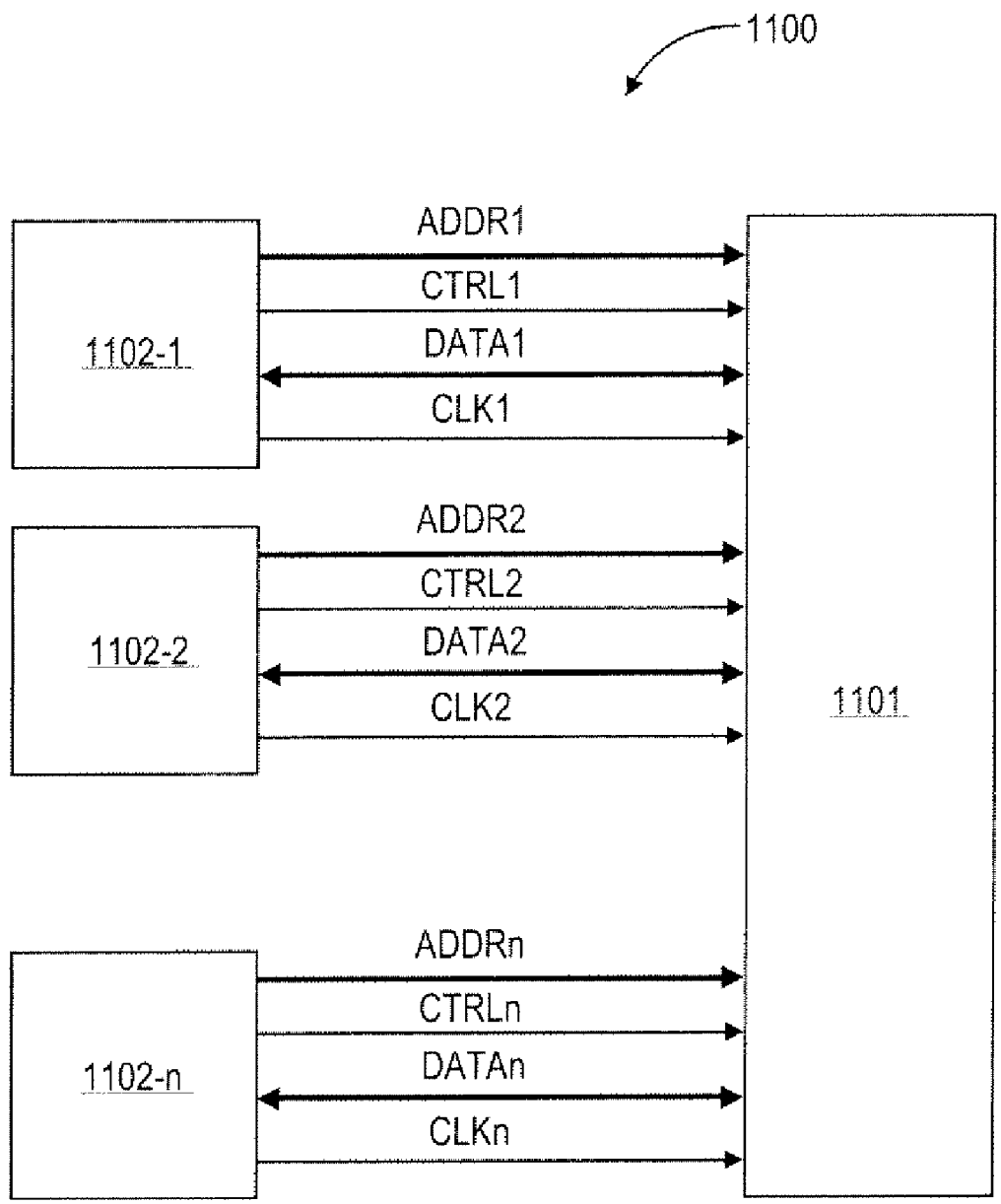
FIG. 11 illustrates a system in one embodiment of a synchronous multi-port memory.

It will be appreciated by one of ordinary skill in the art that, while embodiments of a synchronous multi-port memory have been described in terms of a dual-port memory for convenience, others embodiments with more than two ports may be realized as illustrated in FIG. 11. In FIG. 11, a processing system 1100 includes synchronous multi-port memory 1101 and a plurality of processing devices 1102-1 through 11-2-n, where each of processing device 1102-1 through 1102-n may be any type of general purpose processor (e.g., a microprocessor) or special purpose processor (e.g., an FPGA, ASIC or DSP).

Thus, a method and apparatus for a synchronous multi-port memory has been described. It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method of arbitrating a memory access conflict, the method comprising:
    shifting a memory address of a memory array, a first write-enable value and a first write data from a first input stage to a first delay stage, wherein the first write-enable value and first write data arrive first in time;
    shifting the memory address, a second write-enable value and a second write data from a second input stage to a second delay stage, wherein the second write-enable value and second write data arrive second in time; and
    conditionally blocking the second write data from accessing the memory array due to the second write data arriving second in time wherein the conditionally blocking the second write data comprises clearing a control delay element in the second delay stage by clearing the second write-enable value from the second delay stage, wherein conditionally blocking the second write data comprises asserting a write disable signal at the memory array for the data arriving second in time.

2. The method of claim 1, wherein the first write data accesses the memory array before the second write data.

3. An apparatus, comprising:
    a plurality of ports; and
    selection logic coupled with the plurality of ports to arbitrate among a plurality of contending memory access requests to a memory array and to select a prevailing memory access request from a prevailing one of the plurality of ports, wherein each of the plurality of ports comprises a control input element, a control delay element and an address multiplexer coupled with an address input element and an address delay element, wherein the selection logic comprises an arbitration unit coupled to the address input element, the arbitration unit to determine which of the plurality of contending memory access requests occurred first in time, and wherein the selection logic is configured to shift a write-enable value from the control input element to the control delay element for each port of the plurality of ports and to clear the control delay element in a non-prevailing port causing an assertion of a write disable signal at the memory array.

4. The apparatus of claim 3, wherein each port comprises a data multiplexer coupled with an output element and a data delay element of the port.

* * * * *